(12) United States Patent
Qin et al.

(10) Patent No.: US 8,786,968 B2
(45) Date of Patent: Jul. 22, 2014

(54) DATA STORAGE DEVICE INCLUDING A RECORDING CHANNEL, A DETECTOR, AND A NOISE PREDICTION CIRCUIT, AND METHOD OF PROCESSING A SIGNAL IN A DATA STORAGE DEVICE

(71) Applicant: Agency for Science, Technology and Research, Connexis (SG)

(72) Inventors: Zhi Liang Qin, Singapore (SG); Moulay Rachid Elidrissi, Singapore (SG); Kheong Sann Chan, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 13/684,104

(22) Filed: Nov. 21, 2012

(65) Prior Publication Data

US 2013/0128373 A1 May 23, 2013

(30) Foreign Application Priority Data

Nov. 21, 2011 (SG) ................................ 201108620-4

(51) Int. Cl.
*G11B 27/36* (2006.01)
*G11B 5/09* (2006.01)
*G11B 20/10* (2006.01)

(52) U.S. Cl.
USPC ............................................... 360/31; 360/39

(58) Field of Classification Search
None
See application file for complete search history.

(56) References Cited

U.S. PATENT DOCUMENTS

2003/0026028 A1* 2/2003 Ichihara et al. ................. 360/65

* cited by examiner

*Primary Examiner* — Daniell L Negron
(74) *Attorney, Agent, or Firm* — Wolf, Greenfield & Sacks, P.C.

(57) ABSTRACT

According to embodiments of the present invention, a data storage device is provided. The data storage device includes a recording channel configured to carry a signal; a detector configured to detect the signal from the recording channel; and a noise prediction circuit configured to predict noise affecting the recording channel and the detected signal based on a noisy channel model. According to further embodiments of the present invention, a method of processing a signal in a data storage device is also provided.

10 Claims, 7 Drawing Sheets

DATA STORAGE DEVICE INCLUDING A RECORDING CHANNEL, A DETECTOR, AND A NOISE PREDICTION CIRCUIT, AND METHOD OF PROCESSING A SIGNAL IN A DATA STORAGE DEVICE

CROSS-REFERENCE TO RELATED APPLICATION

This application claims the benefit of priority of Singapore patent application No. 20.20-4, filed 21 Nov. 2011, the content of it being hereby incorporated by reference in its entirety for all purposes.

TECHNICAL FIELD

Various embodiments relate to a data storage device and a method for processing a signal in a data storage device.

BACKGROUND

A data storage device, for example hard disk drives (HDDs), conventionally uses Reed Solomon codes as the main codes to ensure the reliability of the information stored on the media in the presence of several distortions introduced by the recording process. These distortions may include:
1. Media noise
2. Intersymbol interference (ISI)
3. Intertrack interference (ITI)
4. Non-linearities (eg: NLTS, PE)
5. Electronics noise (AWGN).

Media noise is the dominant distortion on the recording channel, and its impact is expected to grow as channel density increases and the number of grains storing each channel bit decreases. For example, the ratio of user bits and grains and channel bits may be 1 user bit to 2 grains to 4 channel bits. Channels are currently designed with a certain degree of ISI introduced by the readback process that is mitigated by the equalizer, but typically, with no ITI. That is, the tracks are separated by enough distance that the readback signal is not influenced by the magnetization on the adjacent tracks. However, in the squeeze to higher densities, this may change. Non-linearities may also become more severe as densities increase, however the electronics noise may remain somewhat unaffected and may be of much lesser significance as compared to the other type of distortions.

The HDD recording channel have progressed from Reed-Solomon Codes to LDPC codes and using iterative decoders.

Low-density parity-check (LDPC) codes and iterative detectors are computationally intensive for implementation in a real (real-life) system. However, with the progression of the technology in implementing algorithms in silicon, together with complexity reduction of the detection/decoding algorithms, virtually all HDD recording channels are currently LDPC coded and iteratively decoded. However, the message passing algorithm used in the iterative decoder is not optimal.

SUMMARY

According to an embodiment, a data storage device is provided. The data storage device may include a recording channel configured to carry a signal; a detector configured to detect the signal from the recording channel; and a noise prediction circuit configured to predict noise affecting the recording channel and the detected signal based on a noisy channel model.

According to an embodiment, a method of processing a signal in a data storage device is provided. The method may include providing a recording channel; detecting a signal from the recording channel; and predicting noise affecting the recording channel and the detected signal based on a noisy channel model.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of a method are analogously valid for a device, and vice versa.

In the context of various embodiments, the articles "a", "an" and "the" as used with regard to a feature or element includes a reference to one or more of the features or elements.

In the context of various embodiments, the phrase "at least substantially" may include "exactly" and a reasonable variance.

As used herein, the term "and/or" includes any and all combinations of one or more of the associated listed items.

Various embodiments relate to coding and detecting for magnetic recording channels of a data storage device. The data storage device may include a memory which is for example used in the processing carried out by the data storage device. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

Various embodiments may provide an implementation for two dimensional coding schemes for high track density and high intertrack interference.

Figure 1:
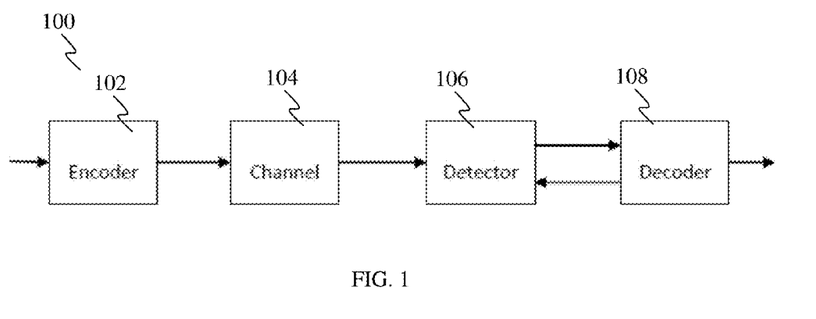
FIG. 1 shows a block diagram of an iterative recording channel of a HDD, according to various embodiments.

FIG. 1 shows the architecture of recording channels of a known HDD. In FIG. 1, the HDD system 100 includes an encoder 102, a channel model 104 followed by an iterative detector 106, and decoder 108. The channel model 104 reproduces or models the waveforms from the HDD for testing of the detector (106)/decoder (108).

Figure 5:
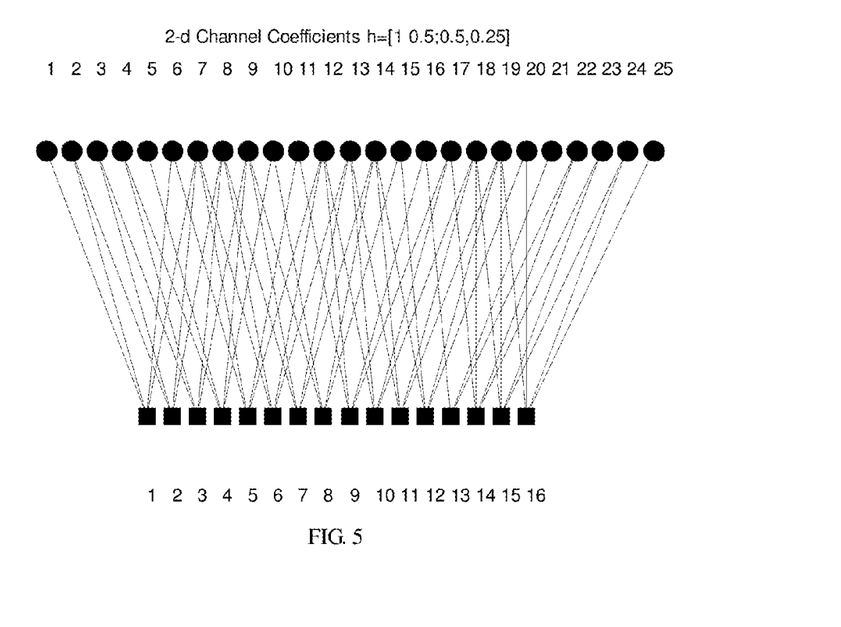
FIG. 5 shows a non-limiting example of a channel graph for a 2-dimensional channel, according to various embodiments.

Two algorithms are operated over two separate graphs. For example, the BCJR (Bahl-Cocke-Jelinek-Raviv) algorithm is used in the detector 106 (i.e., over the detecting trellis) and a message passing algorithm is used by the decoder 108 (i.e., over the code factor graph in the case of low density parity check (LDPC) codes). A factor graph is an undirected bipartite graph connecting variable nodes and check nodes. An example of a factor graph is shown in FIG. 5 where the circular nodes may denote the variable nodes and the square nodes may denote the check nodes. Each check node represents a parity-check operation over the variables it is connected to. The structure of the factor graph is such that the belief propagating algorithm, (also known as the sum-product algorithm) may be implemented on it. Soft information is iterated between the detector 106 and the decoder 108.

Figure 2:
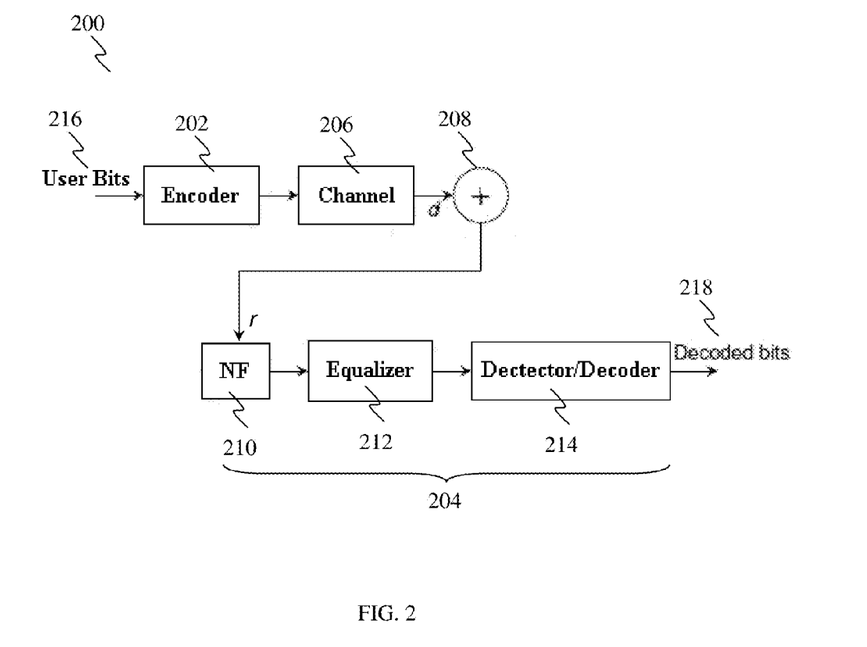
FIG. 2 shows a block diagram of a recording channel of a HDD implemented with a joint detector/decoder, according to various embodiments.

In general, to improve over the iterative schemes used in known (or conventional) systems (e.g., as shown in FIG. 1), joint detection/decoding schemes in which the graphs used within the detector and decoder are combined together into a larger graph, have been explored. FIG. 2 shows the architecture of a recording channel of a HDD implemented with a joint detector/decoder.

In FIG. 2, the system 200 includes an encoder 202 (for example, a LDPC encoder) and a receiving end 204 communicating with each other via a channel 206 having additive white Gaussian noise (AWGN) 208. The receiving end 204 includes a noise filer (NF) 210, an equalizer 212 and a joint detector/decoder 214. Users bits 216 are input to the encoder 202 and decoded bits 218 are obtained from the output of the receiving end 204.

The message passing algorithm is then adapted to run on the larger graph of the joint detector/decoder 214. However the channels (e.g., the channel 206 of FIG. 2) over which these joint detection/decoding schemes (e.g., the joint detector/decoder 214 of FIG. 2) have been tested are, for example, based on simplistic ISI plus AWGN (e.g., the AWGN 208 of FIG. 2).

The channel (e.g., the channel 206 of FIG. 2) is a one dimensional channel.

The channel (e.g., the channel 206 of FIG. 2) may be a simple 1+D channel. As used herein, the term "1+D" refers to a block having an output that is equal to its input plus a delayed version of that input.

For illustration and clarification purposes only, in general, the term "D" refers to a block that incurs a unit delay, while a block incurring no delay is simply represented by the term "1". In a different example, the term "1−D" may refer to a block having an output that is given by its input minus a delayed version of that input Such simplistic channel models provide basis for testing and proving the viability of the concept of joint detection/decoding.

In order that the invention may be readily understood and put into practical effect, particular embodiments will now be described by way of examples and not limitations, and with reference to the figures.

Figure 3A:
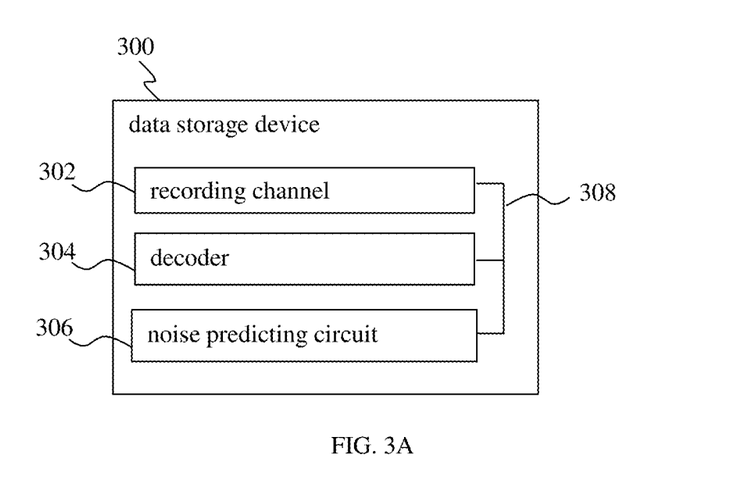
FIG. 3A and FIG. 3C show schematic block diagrams of data storage devices, according to various embodiments.

FIG. 3A shows a schematic block diagram of a data storage device 300, according to various embodiments. The data storage device 300 includes a recording channel 302 configured to carry a signal; a detector 304 configured to detect the signal from the recording channel; and a noise prediction circuit 306 configured to predict noise affecting the recording channel and the detected signal based on a noisy channel model. In FIG. 3A, the line represented as 308 is illustrated to show the relationship between the recording channel 302, the detector 304, and a noise prediction circuit 306, which may include electrical coupling and/or mechanical coupling.

In the context of various embodiments, the data storage device (e.g., the data storage device 300) may be a hard disk drive (HDD).

In the context of various embodiments, the term "recording channel" refers to a channel providing a link between an encoder (e.g., the encoder 202 of FIG. 2) and a receiving end which includes the detector 304. The receiving end may refer to the receiving end 204 of FIG. 2. The recording channel 302 may include a recording medium (or may be interchangeably referred to as a storage medium) configured to store the signal. The recording medium may refer to a disk or platter of the HDD.

The term "signal" may refer to encoded user bits or bit patterns read out of the recording medium that are subsequently detected by the detector 304.

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g., a microprocessor (e.g., a Complex Instruction Set Computer (CISC) processor or a Reduced Instruction Set Computer (RISC) processor). A "circuit" may also be a processor executing software, e.g., any kind of computer program, e.g., a computer program using a virtual machine code such as e.g., Java. Any other kind of implementation of the respective functions which will be described in more detail below may also be understood as a "circuit" in accordance with an alternative embodiment.

As used herein, the phrase "noisy channel model" refers to a non-ideal channel model. For example, the noisy channel model may include noise (e.g., at least one of media noise, ISI, ITI, non-linear noise, or electronic noise).

In some embodiments, the noise may include at least one of channel noise or media noise.

In various embodiments, the data storage device 300 may further include a decoder configured to decode the detected signal based on the predicted noise.

As used herein, "based on the predicted noise" may refer to providing an adjustment to the signal such that the decoded signal may be at least substantially noiseless signal or free from noise that have been taken into consideration by the noisy channel model. In other words, the recovered signal may contain minimal noise distortions. For example, the adjustment may be a subtraction of the predicted noise from the signal.

In various embodiments, the detector 304 and the decoder may form a joint detector/decoder circuit. For example, the joint detector/decoder circuit may be referred to as a joint detector/decoder.

In various embodiments, the joint detector/decoder circuit may be a low density parity check (LDPC) decoder. The joint detector/decoder circuit may be an iterative joint detector/decoder circuit or more specifically, an iterative LDPC joint detector/decoder circuit. For example, LDPC code is a linear error correcting code and may be defined by a sparse parity-check matrix The phrase "joint detector/decoder circuit" refers to a joint detector/decoder performing detection and decoding in a single stage. For example, jointly detecting and decoding may be implemented by the detector/decoder 214 of FIG. 2. The joint detector/decoder is different from the conventional configuration that separates channel detection and decoding (e.g., LDPC decoding) into two stages.

For example, in the conventional configuration, the BCJR algorithm is used to perform channel detection based on the channel trellis and the received signal. The output from the BCJR channel detector is input into the LDPC decoder, which in turn performs message-passing over the LDPC code graph and feeds back the soft information generated to the BCJR channel detector.

In contrast, the joint detector/decoder uses a factor graph (instead of a trellis as used in the conventional configuration) to represent the recording channel and forms a larger graph by joining the channel factor graph into the LDPC code graph over which message-passing is performed.

In some embodiments, the noisy channel model may include a single channel graph model. The single channel graph model may be provided by the LDPC bit nodes and the channel check nodes.

As used herein, the term "graph model" refers to a probabilistic model for which a graph denotes the conditional independence structure between random variables. In general, probabilistic graphical models use a graph-based representation as the foundation for encoding a complete distribution over a multi-dimensional space and a graph that is a compact or factorized representation of a set of independences that hold in the specific distribution.

In these embodiments, the joint detector/decoder circuit may have a layered structure including low density parity check (LDPC) check nodes, low density parity check (LDPC) bit nodes, and channel check nodes. The layered structure may be as described below for FIG. 4.

In other embodiments, the noisy channel model may include a two-dimensional channel graph model. In an embodiment, the two-dimensional channel graph model may be represented by a single channel graph. In another embodiment, the joint detector/decoder circuit may have a layered structure including a serial concatenation of a rowwise binary channel and a columnwise non-binary channel. For example, the serial concatenation of the rowwise binary channel and the columnwise non-binary channel may include low density parity check check nodes, bit nodes of a rowwise binary channel graph, check nodes of a rowwise binary channel graph, symbol nodes of a columnwise non-binary channel graph, and check nodes of a columnwise non-binary channel graph. The layered structure may be as described below for FIG. 6. The two-dimensional channel graph model may be provided by a first graph of the check nodes of the columnwise non-binary channel graph and the symbol nodes of the columnwise non-binary channel graph; and a second graph of the check nodes of the rowwise binary channel graph and the bit nodes of the rowwise binary channel graph. For example, the rowwise binary channel and the columnwise non-binary channel may include a rowwise binary-input 1-dimensional channel and a columnwise non-binary-input 1-dimensional channel.

In one embodiment, the noisy channel model may include an equalized channel model. When a channel has been "equalized" the frequency domain attributes of the signal at the input may be faithfully reproduced at the output.

In various embodiments, the noise prediction circuit 306 may form an integral part of the joint detector/decoder circuit 304.

In various embodiments, the noise prediction circuit 306 may include a data dependent noise prediction circuit. For example, the noise prediction circuit may utilize Noise-Predictive Maximum-Likelihood (NPML) detection or adaptive data dependent noise prediction. The NPML detection uses the transmitted bits previously detected to reconstruct channel noise; while the data dependent noise prediction further enhances the effectiveness at the cost of higher complexities by incorporating specific data patterns in noise reconstruction. NPML is a technology used in current HDDs.

For example, in a HDD system, data are read back as a weak and noisy analog signal by the head, and the noise prediction circuit aims to provide a method of minimizing the influence of noise in the detection process. By doing so, it may allow recording data at higher areal densities than other detection schemes, such as partial response Maximum Likelihood (PRML), and Extended Partial-Response Maximum Likelihood (EPRML) detection.

Noise prediction predicts the most likely next noise sample when the noise is coloured. When the noise is coloured, there is correlation between samples and future samples may be predicted based on present and past noise samples. When the noise is white, there is no correlation and the probability of a future noise sample may not be predicted or determined based on the present and past noise samples. When noise is coloured, a best guess (or prediction) as to what the next noise sample may be made and based on that guess, better estimates at the data bits may be made.

In some examples, noise prediction may be incorporated with detectors such as the Viterbi detector, the SOVA (soft output Viterbi algorithm) and the BCJR detector. Each of these exemplary detectors may be optimal when the noise is white. When the noise is coloured, any detector that is optimum for white noise, is no longer optimal for coloured noise. By including noise prediction into the detector, some of the lost performance may be regained or recovered at the cost of more computations needed for predicting the noise.

Although advances in head and media technologies have been the driving forces behind the increases in the areal recording density, digital signal processing and coding established themselves advantageously as cost-efficient techniques for enabling additional substantial increases in areal density while preserving the high reliability of HDD systems.

Figure 3B:
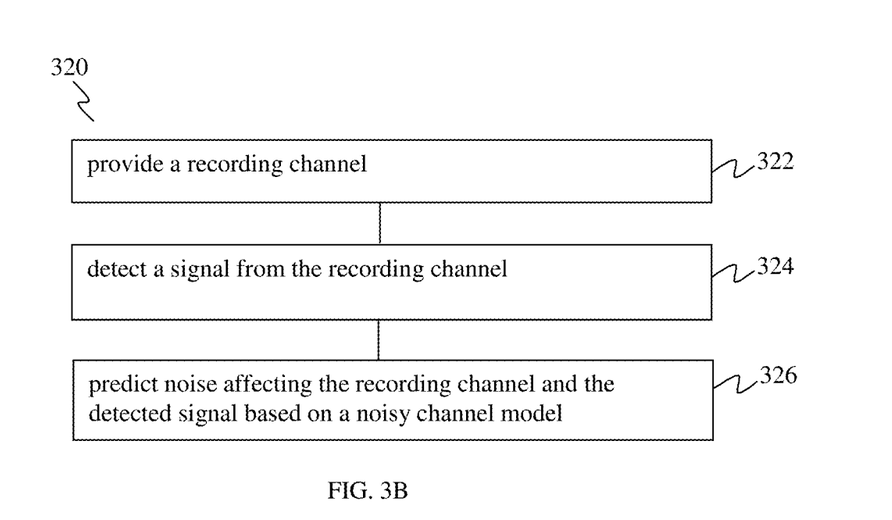
FIG. 3B shows a flow chart illustrating a method for processing a signal in a data storage device, according to various embodiments.
Figure 3C:
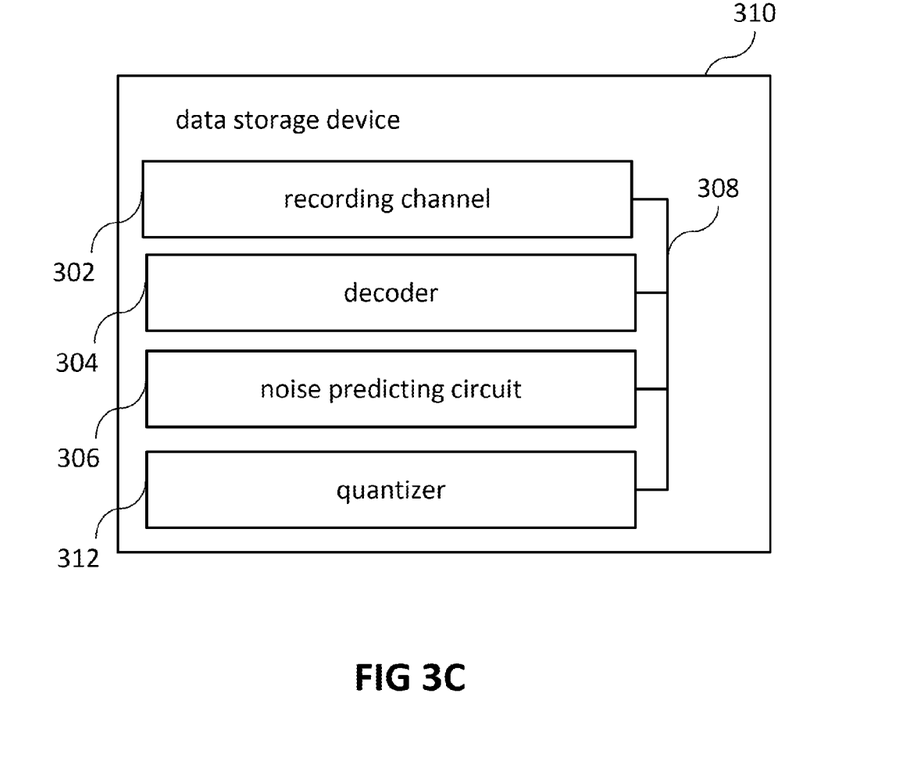

In various embodiments, the data storage device 300 may further include a quantizer (for example a quantizer 312 as shown in the data storage device 310 of FIG. 3C) arranged to quantize the signal from the recording channel. For example, the quantizer may be a q-bit quantizer where q may be 1, 2, 3, . . . . By quantizing a signal, the signal may be represented by a simplified (quantized) bit pattern and this may advantageously reduce the complexity of detection and decoding, especially joint detection and decoding. The quantizer may be a uniform quantizer with suitably chosen parameters, such as the number of quantization bits and quantization intervals, or a non-uniform quantizer that is optimal in the sense of minimum-square-error (MSE).

In various embodiments, the data storage device 300 may further include an encoder arranged to encode user data for storing in the recording medium. For example, the encoder may be a low density parity check (LDPC) encoder. The LDPC code is defined by a sparse parity check matrix. Encoding of LDPC codes may be efficiently implemented in data storage device 300 for certain classes of LDPC codes, for instance, LDPC codes with cyclic or quasi-cyclic properties.

FIG. 3B shows a flow chart 320 illustrating a method for processing a signal in a data storage device, according to various embodiments.

At 322, a recording channel may be provided. At 324, a signal from the recording channel may be detected. At 326, noise affecting the recording channel and the detected signal may be predicted based on a noisy channel model.

The data storage device may be the data storage device 300 of FIG. 3A.

The terms "recording channel", "noise", "predicted", and "noisy channel model" may be defined as above.

As described above, the method 320 may further include decoding the detected signal based on the predicted noise. Detecting a signal from the recording channel at 324 and decoding the detected signal may include jointly detecting and decoding the signal. Detecting and decoding the signal may include detecting and decoding the signal using a low density parity check (LDPC) code. For example, detecting and decoding the signal may include performing iterative (joint) detecting and decoding of the signal.

In one embodiment, the noisy channel model may include a single channel graph model. In this embodiment, detecting and decoding the signal may be based on a layered structure including low density parity check check nodes, low density parity check bit nodes, and channel check nodes. In another embodiment, the noisy channel model may include a two-dimensional channel graph model. In an embodiment, the two-dimensional channel graph model may be represented by a single channel graph. In another embodiment, detecting and decoding the signal may be based on a layered structure including low density parity check check nodes, bit nodes of a rowwise binary channel graph, check nodes of a rowwise binary channel graph, symbol nodes of a columnwise non-binary channel graph, and check nodes of a columnwise non-binary channel graph.

The recording channel may include a recording medium configured to store the signal. Predicting noise at 326 may include predicting data dependent noise. The noise prediction circuit may include a data dependent noise prediction circuit. The noisy channel model may include an equalized channel model. The noise may include at least one of channel noise or media noise.

The terms "noise prediction circuit", "recording medium", "equalized channel model", "based on the predicted noise", "jointly detecting and decoding", "graph model", "low density parity check" (LDPC), "single channel graph", and "two-dimensional channel graph" may be defined as above.

In various embodiments, the method 320 may further include quantizing the signal from the recording channel.

The term "quantizing" may be as defined above. The quantizing may refer to q-bit quantizing where q may be 1, 2, 3, . . . .

In various embodiments, the method 320 may further include encoding user data for storing in the recording medium The term "encoding" may be defined as above.

In one example, encoding the user data may include encoding the user data using a low density parity check (LDPC) code.

Various embodiments may provide a method and apparatus to implement a joint detection/decoding scheme over more realistic channels and in the process increase the complexity and remove some idealistic assumptions.

The channel model may include an equalized channel model in place of the ideal 1-D channel model. The term "1-D" is defined as above. This provides coloring of the channel noise that is expected to degrade the performance of the joint detector and decoder.

Media noise is also included. Media noise is naturally a colored and also data dependent process. The effect of implementing these two realistic channel distortions warrants a more complex joint detector/decoder scheme as compared to a simplistic channel model as described hereinabove.

The joint detector/decoder system may include noise prediction. This increases the overall performance at the cost of greater complexity The joint detector/decoder may include data dependent noise prediction. Similarly, this increases performance at the expense of additional computational complexity.

The algorithms for the joint detector/decoder may be overly complex for practical implementation. Therefore, different approaches may be employed to reduce the complexity and make it feasible for the joint detector/decoder to be implemented via hardware while sacrificing a minimum amount of performance possible.

For example, different ways of quantizing the information in the message passing algorithm may be used, as certain quantization choices lead to minimal reduction in performance for instance, a uniform quantizer with suitably chosen parameters, such as the number of quantization bits and quantization intervals, or a non-uniform quantizer that is optimal in the sense of minimum-square-error (MSE).

Various embodiments may provide a data storage device (e.g., the data storage device 300 of FIG. 3A) and a method for implementing two dimensional coding schemes for high track density and high intertrack interference.

Improved performance is observed with gain in areal density. High complexity arises in implementing two dimensional coding schemes as compared to one dimensional coding schemes. Complexity reduction methods are used and implementation and testing may be performed over generic framing procedure (GFP) channel model.

Figure 4:
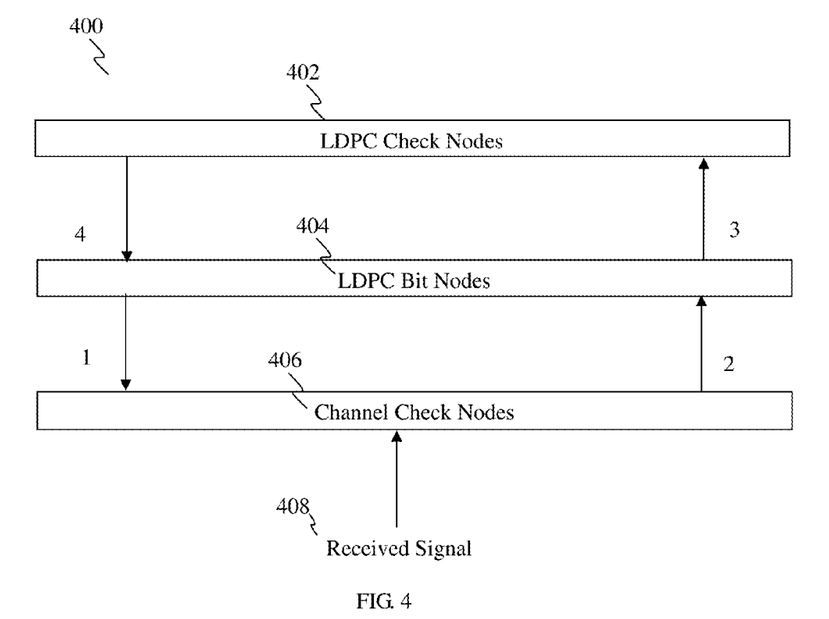
FIG. 4 shows a block diagram of the joint detector/decoder for a 1-dimensional channel, according to various embodiments.

FIG. 4 shows the block diagram of the joint detector and decoder for a 1-dimensional channel 400. There are a total of three layers in the diagram. The upper two layers represent the LDPC code graph including or consisting of LDPC check nodes 402 and LDPC bit nodes 404; while the lower two layers represent the 1-dimensional channel graph with channel check nodes 406 indicating the intersymbol interference induced between the LDPC code bits when transmitted over the channel. The received signal 408 is input to the channel check nodes.

The joint detector/decoder works as follows.
Step 1) LDPC bit nodes 404 propagates probabilistic information to channel check nodes 406.
Step 2) channel check nodes 406 sends back updated information to LDPC bit nodes 404.
Step 3) LDPC bit nodes 404 generate probabilistic information to LDPC check nodes 402 based on the input produced in the previous step.
Step 4) LDPC check nodes 402 sends back updated information to LDPC bit nodes 404.

At the end of Step 4), the joint detector/decoder makes hard decisions on LDPC code bits 402 and also performs syndrome checks. If the hard decision satisfies all syndrome checks, it is deemed to be a valid LDPC codeword and the joint detector/decoder stops. Otherwise, it operates for a pre-determined number of iterations and delivers the hard decision made at the last iteration.

For the 2-dimensional channel, the channel model is given by, $$r(i, j) = \sum_{p=0}^{m} \sum_{q=0}^{m} h_{p,q} x(i-p, j-q) + n(i, j)$$

where h is a l×l 2-dimensional channel matrix, x denotes LDPC code bits transmitted over the 2-dimensional channel and arranged into a k×k matrix, and n is the channel noise. l and k may independently be 1, 2, 3, . . . .

The joint detector/decoder for the 2-dimensional channel adopts a similar structure as that for the 1-dimensional channel, where a single channel graph may be used to represent the 2-dimensional channel. However, the 2-dimensional channel graph contains a plurality of short length-4 cycles.

For illustration purposes, FIG. 5 shows the channel graph of a 2-dimensional channel, where the channel matrix h is assumed to be a 2×2 matrix.

Without loss of generality, a 2-dimensional channel with channel coefficients h given by a 2×2 matrix is considered. Table 1 shows the number of length-4 cycles when the transmitted bits are arranged into a k×k square matrix, where k takes on various values. From Table 1, it is observed that the number of length-4 cycles increases significantly with larger k values.

TABLE 1

|  | k = 8 | k = 16 | k = 32 | k = 64 | k = 100 | k = 128 | k = 181 |
| --- | --- | --- | --- | --- | --- | --- | --- |
| Number of Length-4 Cycles | 144 | 544 | 2112 | 8320 | 20200 | 33024 | 65884 |

Table 2 shows the number of length-4 cycles for 2-dimensional channels with l×l channel matrix, where the transmitted bits are arranged into a 67×67 matrix (i.e., k=67 for illustration purposes only and it should be appreciated that k may adopt any other value). Similarly as in Table 1, the number of length-4 cycles increases significantly with larger l values.

TABLE 2

|  | l = 2 | l = 3 | l = 4 | l = 5 | l = 6 |
| --- | --- | --- | --- | --- | --- |
| Number of Length-4 Cycles | 9112 | 242210 | 1713900 | 7297350 | 23309720 |

Simulation results shows that the existence of a large number of length-4 cycles in the 2-dimensional channel graph impairs the performance of the joint detector/decoder significantly and causes a large performance loss. For high-rate LDPC coded systems, the joint detector/decoder circuit (or interchangably referred to as joint receiver) based on a single channel graph performs worse than the conventional scheme that performs 2-dimensional BCJR channel detection followed by LDPC decoding.

Hence, a novel joint detector/decoder for 2-dimensional channels, according to various embodiments, may be provided. Rather than using a single graph to represent the 2-dimensional channel, the 2-dimensional channel may be viewed as a serial concatenation of a rowwise binary-input 1-dimensional channel and a columnwise non-binary-input 1-dimensional channel. Based on this configuration, a binary graph is used to represent the 1-dimensional channel and a non-binary graph is used to represent the columnwise channel. In other word, the 2-dimensional channel may be represented as a serial concatenation of a rowwise binary graph and a columnwise non-binary graph.

Figure 6:
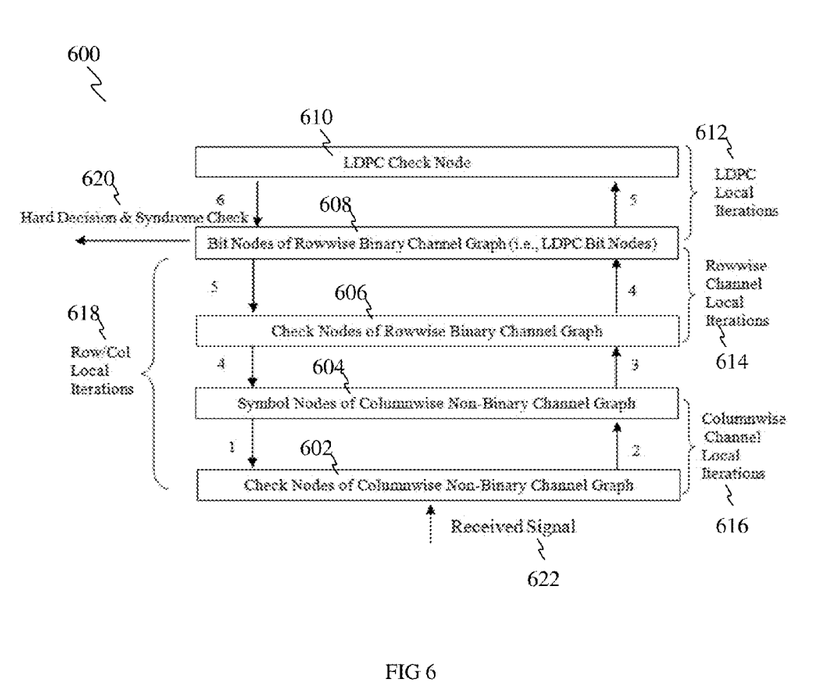
FIG. 6 shows a block diagram of the joint detector/decoder for 2-dimensional channels, according to various embodiments.

FIG. 6 shows the block diagram of the joint detector/decoder for 2-dimensional channels 600. There are a total of 5 layers in FIG. 6, where the lowest two layers represent the columnwise nonbinary graph 602, 604, the next two layers represent the rowwise binary graph 606, and the upper two layers represent the LDPC code graph 608, 610.

The joint receiver involves the following 6 steps:
Step 1) Columnwise symbol nodes 604 pass information to columnwise channel check nodes 602.
Step 2) columnwise channel check nodes 602 to columnwise channel symbol nodes 604.
Step 3) columnwise channel symbol nodes 604 to rowwise channel check nodes 606.
Step 4) rowwise channel check nodes 606 to rowwise bit nodes (i.e., LDPC bit nodes) 608.
Step 5) LDPC bit nodes 608 to LDPC check nodes 610.
Step 6) LDPC check nodes 610 to LDPC bit nodes 608.

At the end of Step 6), the joint detector/decoder circuit makes a hard decision on the LDPC codeword and stops if the codeword is valid; otherwise, it returns to Step 1) until a pre-determined number of iterations is reached. Within the columnwise/rowwise detection and LDPC decoding, a multiple number of local iterations may be invoked as indicated in FIG. 6. Rowwise bit nodes (i.e., LDPC bit nodes) 608 and LDPC check nodes 610 form LDPC local iterations 612. Rowwise channel check nodes 606 and rowwise bit nodes (i.e., LDPC bit nodes) 608 form rowwise channel local iterations 614. Columnwise channel check nodes 602 and columnwise channel symbol nodes 604 form columnwise channel local iterations 616. Columnwise channel local iterations 616 and rowwise bit nodes (i.e., LDPC bit nodes) 608 forms row/column local iterations 618. Rowwise bit nodes (i.e., LDPC bit nodes) 608 further provide hard decision and syndrome check 620.

Figure 7:
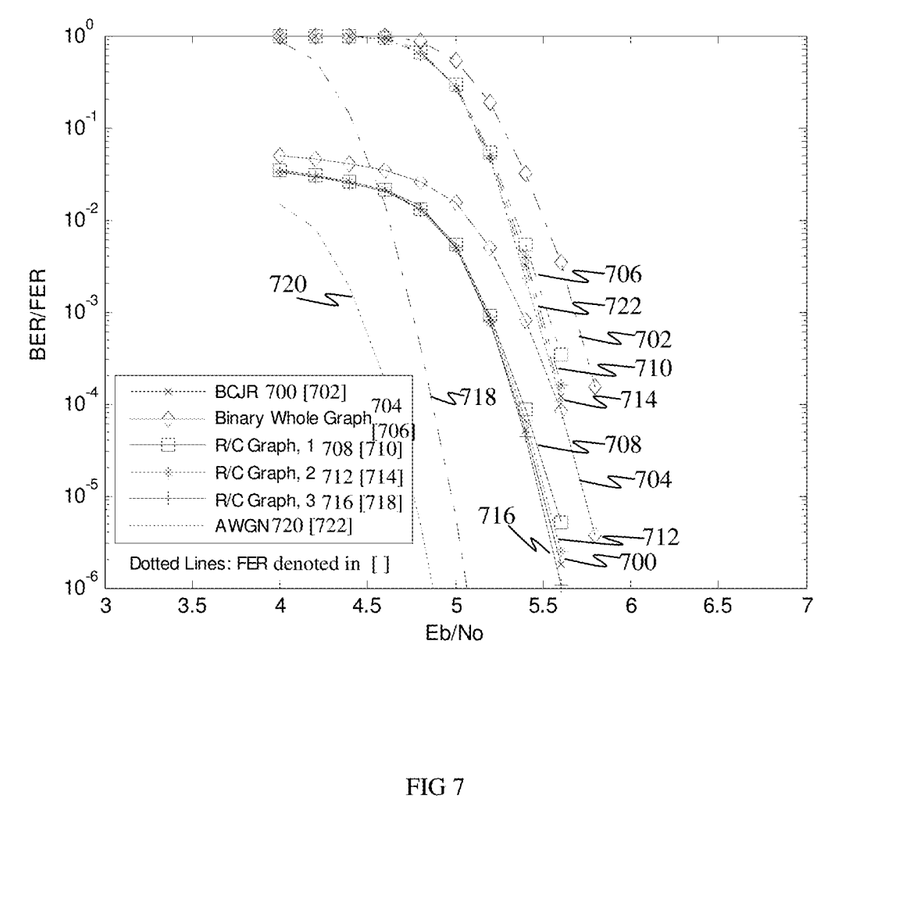
FIG. 7 shows the BER/FER performance of the joint detector/decoder based on the single binary graph, according to various embodiments.

FIG. 7 shows the simulated performance of the joint detector/decoder for a 2-dimensional channel. Without loss of generality, the 2-dimensional channel matrix is assumed to be given by h=[1 0.5; 0.5, 0.25]. The LDPC code used in the simulation is a rate-0.912 regular (4489,4092) quasi-cyclic LDPC code. The column weight of the parity-check matrix of this LDPC code is 6. The LDPC decoding is based on the sum-product algorithm (SPA). Several receivers are considered in the simulation. In FIG. 7, the curve labeled "BCJR" 700, 702 denotes the performance of the conventional separate receiver that serially performs BCJR detection followed by LDPC decoding. The curve labeled "Binary Whole Graph" 704, 706 shows the performance of the joint receiver that uses a single binary graph to represent the 2-dimensional channel. The curves "Row/Col Graph" 708, 710 shows the performance of the joint detector/decoder circuit in accordance to various embodiments that uses a binary/nonbinary graph to represent the rowwise/columnwise component 1-dimensional channel, respectively, with various number of iterations 712, 714, 716, 718 between the columnwise and rowwise detector. The performance of LDPC decoding over additive white Gaussian noise (AWGN) channels 720, 722 is also included in FIG. 7 for comparison purposes. The solid lines represent the bit-error-rates (BER) 700, 704, 708, 712, 716, 720; while the dashed lines represent the frame-error-rates (FER) 702, 706, 710, 714, 718, 722. The BER/FER performance is depends on the energy per bit to noise power spectral density ratio (Eb/No).

FIG. 7 shows that the joint receiver based on the single binary graph 704, 706 has a performance gap of 0.5 dB from that of the BCJR-based receiver 700, 702 at the BER of $10^{-5}$. However, the joint detector/decoder circuit according to various embodiments based on rowwise/columnwise graphs 708, 710, 712, 714, 716, 718 have negligible performance degradation and even performs slightly better than the BCJR receiver 700, 702 at the BER of $10^{-6}$.

Figure 8:
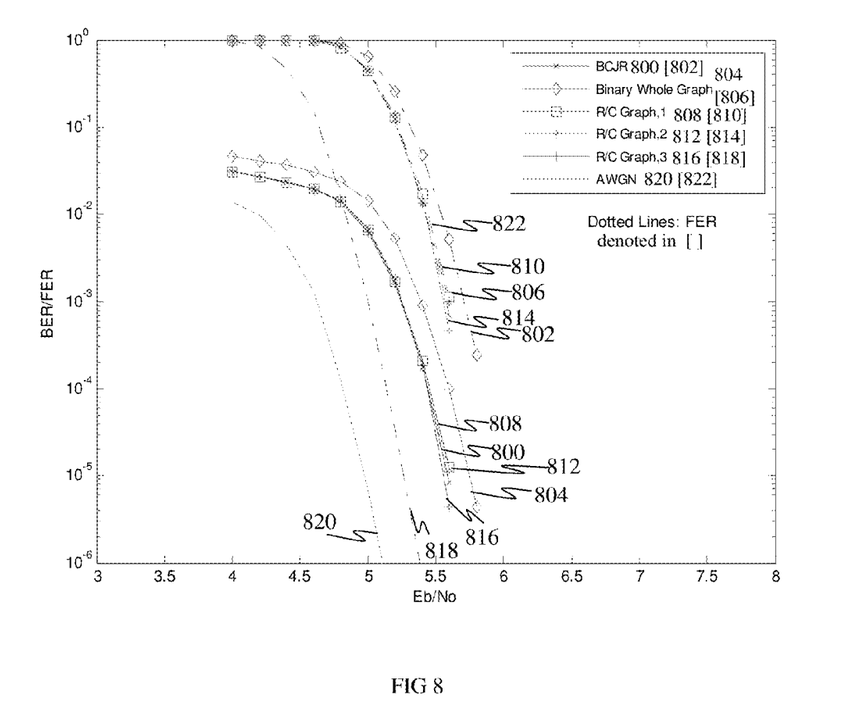
FIG. 8 shows BER/FER performance of the joint detector/decoder based on a higher-rate LDPC coded 2-dimensional channels, according to various embodiments.

In FIG. 8, a higher-rate LDPC coded 2-dimensional channels is considered. The LDPC code used in the simulation is a rate-0.941 (4489, 4224) quasi-cyclic LDPC code. The column weight of the parity check matrix of this LDPC code is 4.

In FIG. 8, the curve labeled "BCJR" 800, 802 denotes the performance of the conventional separate receiver that serially performs BCJR detection followed by LDPC decoding. The curve labeled "Binary Whole Graph" 804, 806 shows the performance of the joint receiver that uses a single binary graph to represent the 2-dimensional channel. The curves "Row/Col Graph" 808, 810 shows the performance of the joint detector/decoder circuit according to various embodiments that uses a binary/nonbinary graph to represent the 2-dimensional channel, with various number of iterations 812, 814, 816, 818 between the columnwise and rowwise detector. The performance of LDPC decoding over additive white Gaussian noise (AWGN) channels 820, 822 is also included in FIG. 8 for comparison purposes. The solid lines represent the bit-error-rates (BER) 800, 804, 808, 812, 816, 820; while the dashed lines represent the frame-error-rates (FER) 802, 806, 810, 814, 818, 822. The BER/FER performance is depends on the energy per bit to noise power spectral density ratio (Eb/No).

FIG. 8 also shows that the joint detector/decoder circuit according to various embodiments based on rowwise/columnwise graphs performs better than the receiver based on a single binary graph. Besides, it achieves almost or substantially the same performance as that of the BCJR receiver.

The graph-based joint detector/decoder circuit for the 2-dimensional channel has the advantage of allowing for parallel processing and hence lower complexities as compared with the conventional separate BCJR-based receiver. By using a rowwise binary/columnwise nonbinary graph to represent channels over these two dimensions, the impact of existence of length-4 cycles on the BER performance has been alleviated. Simulation results show that the 2-dimensional joint detector/decoder circuit suffers minimal or no performance degradation and performs better than the BCJR receiver in low BER regions.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A data storage device comprising:
   a recording channel configured to carry a signal;
   a detector configured to detect the signal from the recording channel;
   a noise prediction circuit configured to predict noise affecting the recording channel and the detected signal based on a noisy channel model; and
   a decoder configured to decode the detected signal based on the predicted noise;
   wherein the detector and the decoder form a joint detector/decoder circuit; and
   wherein the noisy channel model comprises at least one of:
      a single channel graph model, wherein the joint detector/decoder circuit has a layered structure comprising check nodes of low-density parity-check codes, low-density parity-check bit nodes, and channel check nodes; or
      a concatenated channel graph model, wherein the joint detector/decoder circuit has a layered structure comprising a serial concatenation of a rowwise binary channel graph, a columnwise non-binary channel graph, and a low-density parity-check code graph.

2. The data storage device of claim 1, wherein the joint detector/decoder circuit is a low density parity check joint detector/decoder circuit.

3. The data storage device of claim 1, wherein the noise prediction circuit comprises a data dependent noise prediction circuit.

4. The data storage device of claim 1, wherein the noisy channel model comprises an equalized channel model.

5. The data storage device of claim 1, further comprising a quantizer arranged to quantize the signal from the recording channel.

6. The data storage device of claim 1, further comprising an encoder arranged to encode user data for storing in the recording medium.

7. A method of processing a signal in a data storage device, the method comprising:
   providing a recording channel;
   detecting a signal from the recording channel;
   predicting noise affecting the recording channel and the detected signal based on a noisy channel model; and
   decoding the detected signal based on the predicted noise;
   wherein detecting a signal from the recording channel and decoding the detected signal comprise jointly detecting and decoding the signal;
   wherein detecting and decoding the signal is based on at least one of:
      a message-passing algorithm operating on a layered structure comprising low-density parity-check check nodes, low-density parity-check bit nodes, and channel check nodes; or
      a message-passing algorithm operating on a layered structure comprising a serial concatenation of a rowwise binary channel graph, a columnwise non-binary channel graph, and a low-density parity-check code graph.

8. The method of claim 7, wherein predicting noise comprises predicting data dependent noise.

9. The method of claim 7, further comprising quantizing the signal from the recording channel.

10. The method of claim 7, further comprising encoding user data for storing in the recording medium.

* * * * *